United States Patent [19]

Ishiguro et al.

[11] Patent Number: 5,087,890
[45] Date of Patent: Feb. 11, 1992

[54] AMPLIFIER CIRCUIT

[75] Inventors: Kazuhisa Ishiguro; Masanori Fujisawa, both of Gunma, Japan

[73] Assignee: Sanyo Electric Co., Ltd., Moriguchi, Japan

[21] Appl. No.: 584,747

[22] Filed: Sep. 19, 1990

[30] Foreign Application Priority Data

Sep. 20, 1989 [JP] Japan .................. 1-244302
Sep. 20, 1989 [JP] Japan .................. 1-244303

[51] Int. Cl.⁵ .............................. H03F 3/45
[52] U.S. Cl. .................. 330/259; 330/262; 330/265; 330/270; 330/9; 330/293
[58] Field of Search .......... 330/259, 262, 265, 9, 330/270, 290, 293, 97, 85

[56] References Cited

U.S. PATENT DOCUMENTS

| | | | |
|---|---|---|---|
| 3,263,177 | 7/1966 | Durrett | 330/9 |
| 3,768,028 | 10/1973 | Wolcott et al. | 330/9 |
| 3,918,005 | 11/1975 | Bruckenstein et al. | 330/85 |
| 4,490,682 | 12/1984 | Poulo | 330/259 |
| 4,928,059 | 5/1990 | Franklin et al. | 330/9 |

FOREIGN PATENT DOCUMENTS 0077500 4/1983 Fed. Rep. of Germany .
0296992 12/1988 France .
61-225907 10/1986 Japan .................. 330/293

OTHER PUBLICATIONS

IBM Technical Disclosure Bulletin, vol. 26, No. 3B, Aug. 1983, pp. 1377-1378, Engelbrecht: "Input Offset Compensation for Photodiode Amplifier".

*Primary Examiner*—Eugene R. LaRoche
*Assistant Examiner*—Tan Dinh
*Attorney, Agent, or Firm*—Armstrong, Nikaido, Marmelstein, Kubovcik & Murray

[57] ABSTRACT

An amplifier circuit includes a negative feedback connected amplifier and a series circuit comprising a capacitor, one end of which is connected to an output terminal of the amplifier, and a resistor, one end of which is connectable to a reference potential. A comparator is provided which has first and second inputs and one output. The first input is connected to a junction between the capacitor and the resistor, the second input is connected to an output of the amplifier, and the output of the comparator is connected to one input of the amplifier. The comparator does not react to an AC signal of a specific frequency band, but operates to set the output offset voltage only to one fractional part of the transition gain, and therefore operates to accomplish offset compensation without using a large capacitor.

6 Claims, 2 Drawing Sheets

AMPLIFIER CIRCUIT

BACKGROUND OF THE INVENTION

1. Field of the Invention

The present invention relates to an amplifier circuit comprising an offset compensation function, and specifically to an amplifier circuit suited to audio equipment driven by a low voltage power supply.

2. Description of the Prior Art

A conventional amplifier circuit is described hereinbelow with reference to FIGS. 1 and 2.

FIG. 1 shows a non-inverting amplifier circuit wherein an AC signal source expressed by signal amplitude Vs and impedance Rs is connected to a non-inverting input terminal of the amplifier A, and a negative feedback circuit comprising resistors R10 and R11 are connected between an inverting input terminal and output terminal V10 of the amplifier A. Note that sign VOF expresses as a voltage the offset occurring at the input stage of the amplifier A due to a difference in the amplifier A input stage transistor characteristics or a difference in the input circuit impedances.

When the open loop gain of the amplifier A is sufficiently great, the amplifier output V10 of this non-inverting amplifier circuit is $$V10 \approx VOF(R10+R11)/R11 + Vs(R10+R11)/R11 \quad (1),$$

and amplifier circuit output V11 is the result of blocking the AC component of the amplifier output V10 obtained according to the equation (1) by coupling capacitor C10, and can be expressed by the following equation $$V11 \approx Vs(R10+R11)/R11 \quad (2).$$

This non-inverting amplifier circuit is widely used in the initial stage of equalizer amplifiers and audio circuits because a high input impedance is obtained, but presents the problem of being unusable with amplifiers having a narrow dynamic range. Specifically, the input/output characteristics obtained by equation (2) above is satisfied within the dynamic range, and an amplifier in which the dynamic range is narrow due to being low voltage driven clips a half-wave of the AC output when the value of the first component VOF·(R10+R11)/R11 on the right hand side of equation (1) becomes a magnitude sufficiently great that it cannot be ignored compared to the output dynamic range, making high fidelity amplification impossible. In particular, when an SEPP (single-ended push-pull) amplifier which operates at an approximately 1.5 V power battery is used for this amplifier, the value of VOF·(R10+R11)/R11 easily reaches the output dynamic range (±0.5 V) of this amplifier, and high fidelity amplification becomes impossible.

Therefore, to avoid this sort of problem, an amplifier circuit constructed as shown in FIG. 2 is used for a low-voltage operating amplifier circuit.

In FIG. 2, the capacitor C20 is a capacitor added for offset compensation. Because the frequency response of this amplifier circuit is primarily dependent upon the time constant of this capacitor C20 and resistor R21, it is necessary to make the resistor R21 a high resistance or the capacitor C20 a large capacitance in order to prevent deterioration of the frequency response of this amplifier. However, the value of resistor R21 is limited due to closed loop gain control of the amplifier, and it is difficult to set a high resistance due to problems with thermal noise. A resistance of a maximum 1 kΩ is therefore usually used for the resistor R21, and a 50 μF large capacitor is usually used for the capacitor C20.

If the phase component is ignored, the output V20 of the amplifier A in the amplifier circuit shown in FIG. 2 when the amplifier A gain is sufficiently great can be obtained with the following formula $$V20 \approx VOF\{(R20+R21)^2 + Xd^2\}^{\frac{1}{2}}/\{R21^2 + Xd^2\}^{\frac{1}{2}} + \quad (3)$$
$$Vs\{(R20+R21)^2 + Xa^2\}^{\frac{1}{2}}/\{R21^2 + Xa^2\}^{\frac{1}{2}}.$$

However, Xd and Xa are the reactance for the DC and AC, respectively, of the capacitor C20.

If it is considered that $Xd = \infty$, and the circuit is designed such that $R21 \geq Xa$ in the operating frequency range, the above equation (3) can be approximated:

$$V20 \approx VOF + Vs(R20+R21)/R21 \quad (4).$$

Furthermore, the amplifier circuit output V21 passing the coupling capacitor C21 is the component in which the AC component, the first component on the right hand side of equation (4), is blocked, and can be obtained by the equation $$V21 \approx Vs(R20+R21)/R21 \quad (5).$$

As shown in equation (4) above, while the offset voltage of offset conversion is equal to the input offset voltage, thereby solving the clipping problem by the offset voltage, this amplifier circuit presents a new problem of requiring a large capacitor. Furthermore, it is normal for a low voltage operating amplifier circuit to be comprised of chip components, but the technologies enabling the production of a large capacitance capacitor in chip form have not been proposed, and this amplifier circuit therefore presents the problem of a complex assembly process.

SUMMARY OF THE INVENTION

The present invention has as its object to resolve the aforementioned problems existing in the conventional technology by way of providing an amplifier circuit which does not require a large capacitor for offset compensation.

An amplifier circuit according to one preferred embodiment of the present invention comprises a negative feedback connected amplifier; a series circuit comprising a capacitor, one end of which is connected to an output terminal of the amplifier, and a resistor, one end of which is connectable to a reference potential; and a comparator having first and second inputs and one output, the first input being connected to a junction between the capacitor and the resistor, the second input being connected to an output of the amplifier, and the output of comparator being connected to one input of the amplifier.

An amplifier circuit according to another preferred embodiment of the present invention comprises: a negative feedback connected amplifier; a series circuit comprising a resistor, one end of which is connected to an output terminal of the amplifier, and a relatively low capacitance capacitor, one end of which is connectable to a reference potential; and a comparator having first and second inputs and one output, the first input being connected to a junction between the resistor and the capacitor, and the second input being connectable to a reference potential, and the output of the comparator being connected to an input of the amplifier.

The comparator does not react to an AC signal of a specific frequency band, but operates to set the output offset voltage only to one fractional part of the transition gain, and therefore operates to accomplish offset compensation without using a large capacitor.

BRIEF DESCRIPTION OF THE DRAWINGS

These and other objects and features of the present invention will become clear from the following description taken in conjunction with the preferred embodiments' thereof with reference to the accompanying drawings throughout which like parts are designated by like reference numerals, and in which.

DETAILED DESCRIPTION OF THE PREFERRED EMBODIMENTS

First Embodiment

Figure 1:
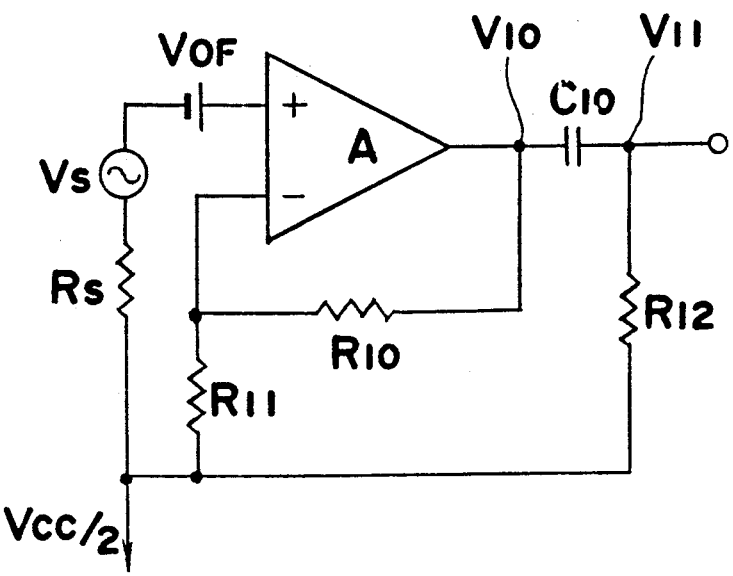
FIG. 1 is a circuit diagram of a conventional non-inverting amplifier circuit.
Figure 2:
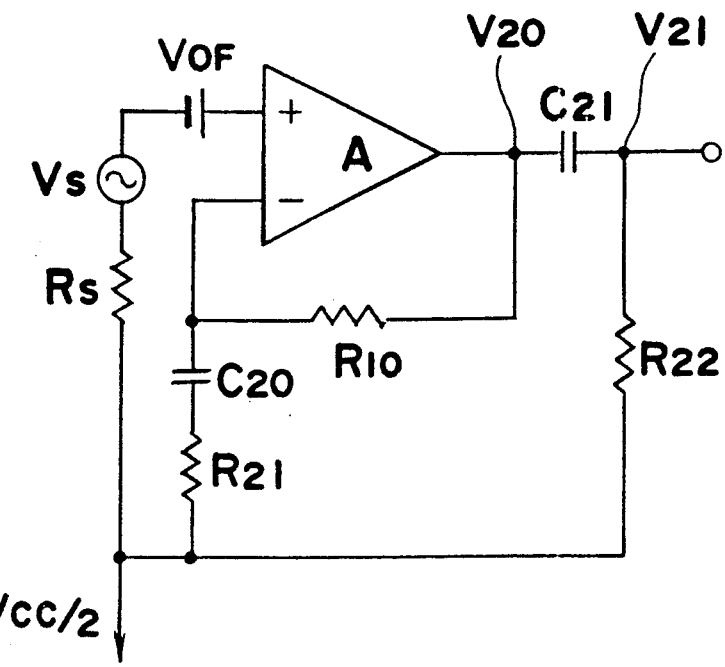
FIG. 2 is a circuit diagram of another conventional non-inverting amplifier circuit provided with an offset compensation function.
Figure 3:
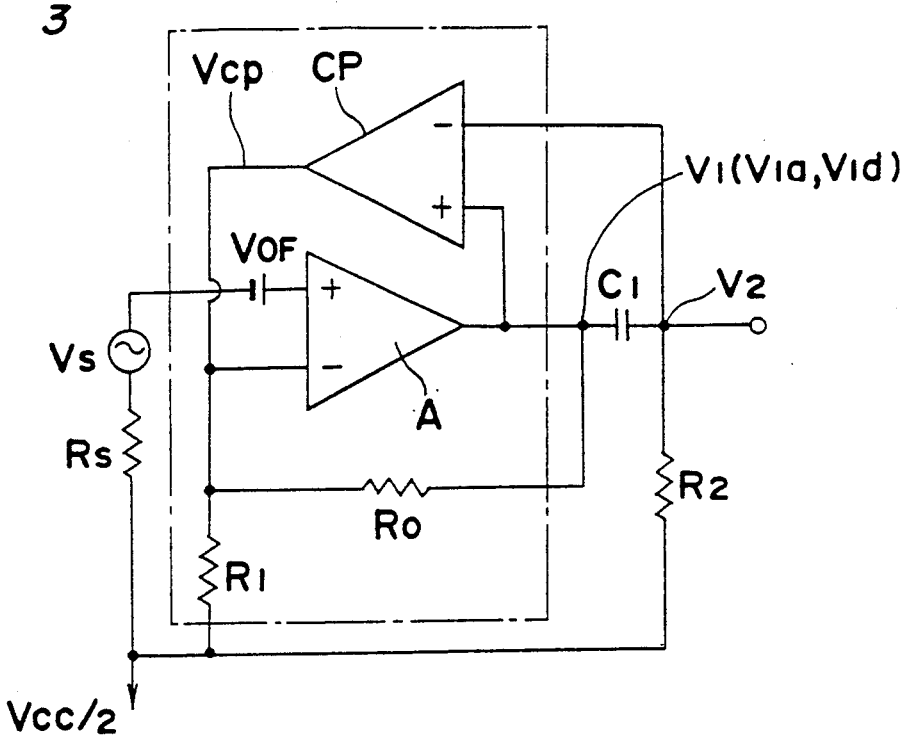
FIG. 3 is a circuit diagram of a first embodiment of the present invention suited to a non-inverting amplifier circuit.

A first embodiment of the present invention is described hereinbelow with reference to FIG. 3.

An amplifier circuit according to the first embodiment comprises an amplifier A in which the closed loop gain is controlled by negative feedback resistors R0 and R1. The non-inverting input terminal of amplifier A is connected an AC signal source expressed by amplitude Vs and impedance Rs, comparator CP, a reference potential source (not shown, only the reference potential is shown in the figure) which generates a voltage equal to half the power supply voltage Vcc, and a series circuit comprising a capacitor C1, one end of which is connected to an output terminal of the amplifier A, and a resistor R2, one end of which is connected to the reference potential. It is to be noted that the series circuit comprising a capacitor C1 and resistor R2 is not a circuit newly added by the present invention, but is a circuit provided on conventional amplifier circuits. Usually, a chip capacitor of approximately 10 $\mu$F is used for the capacitor C1, and a resistor with a resistance of approximately 10 k$\Omega$ is used for the resistor R2. In addition, sign VOF is the offset, expressed as a voltage, generated at the input stage of the amplifier A due to the difference in the characteristics of the input stage transistor of amplifier A or the difference in the impedances of the input circuit.

The operation of the first embodiment thus comprised is next described separately for DC operation and AC operation.

When the amplitude Vs of the AC signal source is Vs=0, the output V1 of the amplifier A obviously becomes the DC component Vld only. Furthermore, the amplifier circuit output V2 in which this DC component Vld is blocked by the coupling capacitor C1 is held at the reference potential ($\frac{1}{2}$Vcc) by the resistor R2. Thus, if GCP (GCP>1) is the transition gain of the comparator CP, the output VCP of the comparator CP, which compares the amplifier output Vld and the amplifier circuit output V2 (V2=$\frac{1}{2}$Vcc), is obtained as $$VCP = (Vld - \tfrac{1}{2}Vcc)GCP \qquad (6).$$

Moreover, if the open loop gain of the amplifier A is GA (GA>1), the DC component Vld of the output of the amplifier A is obtained from $$\{VOF - Vld \cdot R1/(R0+R1) - (Vld - \tfrac{1}{2}Vcc)GCP\}GA = Vld \qquad (7)$$

and thus, $$Vld = \{VOF + (\tfrac{1}{2}Vcc)GCP\}GA/\{1 + GA \cdot R1/(R0+R1) + \qquad (8)$$
$$GCP \cdot GAP\} \approx VOF/GCP + \tfrac{1}{2}Vcc.$$

Here, if it is considered that the value of VOF/GCP is extremely small, then finally $$Vld \approx \tfrac{1}{2}Vcc \qquad (9)$$

is obtained. The above equation (9) shows that the DC level of the amplifier output is fixed at approximately the reference potential ($\frac{1}{2}$Vcc) by operation of the comparator CP.

If the amplitude Vs of the AC signal source is Vs$\neq$0, because it has already been proven that the DC level of the amplifier circuit output is fixed at $\frac{1}{2}$Vcc, the amplifier output V1 is provided as $$V1 \approx \tfrac{1}{2}Vcc + V1a \qquad (10)$$

where the AC component of the amplifier A is V1a, and the amplifier circuit output V2 is provided as $$V2 \approx \tfrac{1}{2}Vcc + V1a \cdot R2/(R2^2 + Xc^2)^{\frac{1}{2}} \qquad (11)$$

where Xc is the reactance of the coupling capacitor C1. Thus, the output VCP of the comparator CP, which compares the amplifier output V1 provided by equation (10) with the amplifier circuit output V2 provided by equation (11), is provided as $$VCP \approx \{V1a - V1a \cdot R2/(R2^2 + Xc^2)^{\frac{1}{2}}\}GCP \qquad (12).$$

Here, if the values of resistor R2 and the coupling capacitor C1 are designed so large as to satisfy $$V1a - V1a \cdot R2/(R2^2 + Xc^2)^{\frac{1}{2}} \neq 0$$

with respect to the maximum value of the AC component V1a of the amplifier output, the comparator CP does not react to the AC component V1a of the amplifier output V1, and VCP=0.

Therefore, the AC component V1a of the output V1 of the amplifier A is obtained from $$\{Vs - V1a \cdot R1/(R0+R1)\}GA \neq V1a$$

as $$V1a \approx Vs(R0+R1)/R1 \qquad (13).$$

From this, the amplifier A output V1, which is the sum of the DC component obtained with equation (9) and the AC component obtained with the above equation (14) is obtained as $$V1 \neq \tfrac{1}{2}Vcc + Vs(R0+R1)/R1 \quad (14),$$

and the amplifier circuit output V2 which blocks by means of the coupling capacitor C1 the DC component of the amplifier output V1 obtained with the above equation (14) is provided as $$V2 \approx VS(R0+R1)/R1 \quad (15).$$

This equation (15) shows that the amplifier circuit according to the present invention operates at the closed loop gain defined by the negative feedback resistor R0 and R1 only. Furthermore, the above equation (8) shows that the output offset voltage of the amplifier A becomes VOF/GCP and the offset problem is avoided even when an SEPP (single-ended push-pull) amplifier operating at a 1.5 V power battery is used.

The present invention was described hereinabove in an embodiment applicable to a non-inverting amplifier circuit, but it will be obvious to those skilled in the art that the present invention can also be applied to inverting amplifier circuits, and even more simple amplifier circuits, and other devices, for example, equalizer amplifiers. Furthermore, it should also be noted that while there is no problem comprising this amplifier circuit of discrete components, it is particularly effective from the perspective of assembly when the amplifier A, comparator CP, and reference potential source are integrated to a single chip.

Second Embodiment

Figure 4:
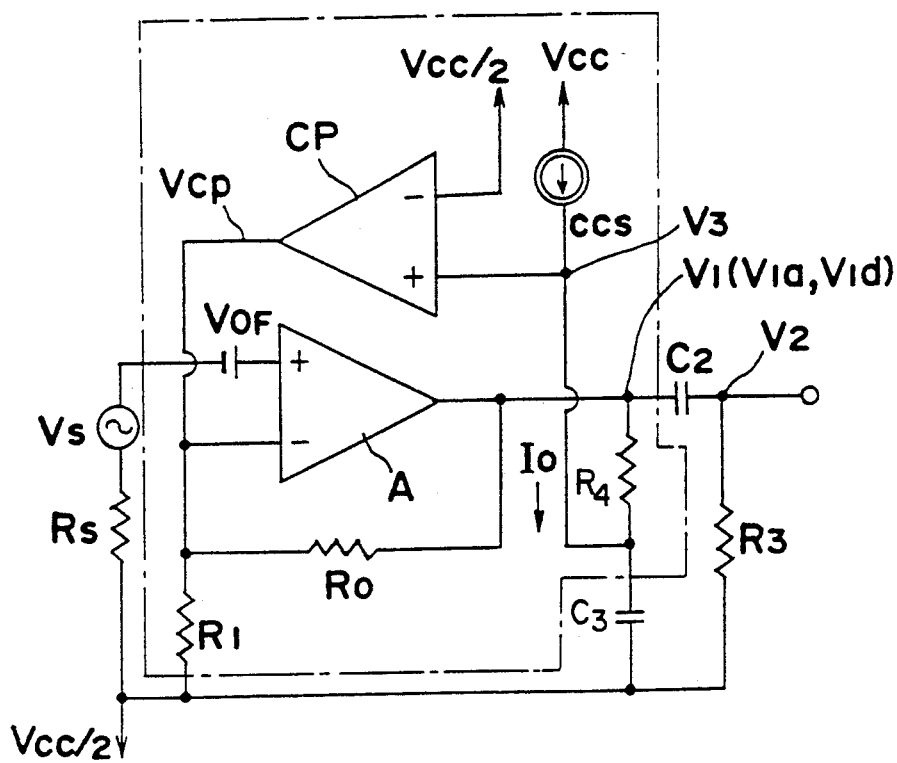
FIG. 4 is a circuit diagram of a second embodiment of the present invention suited to a non-inverting amplifier circuit.

A second embodiment of the present invention is described hereinbelow with reference to FIG. 4.

The second embodiment of the present invention comprises an amplifier A in which the closed loop gain is controlled by negative feedback resistors R0 and R1, comparator CP, constant current source CCS, a reference potential source (only the reference potential is shown in the figure, the reference potential source is not shown) which generates a voltage equal to half the power supply voltage Vcc, a first series circuit comprising a resistor R4, one end of which is connected to an output terminal of the amplifier A, and a capacitor C3 with a relatively small capacity, one end of which is connected to the reference potential, and a second series circuit comprising a capacitor C2, one end of which is connected to an output terminal of the amplifier A, and a resistor R3, one end of which is connected to the reference potential. It is to be noted that while there is no problem comprising this amplifier circuit of discrete components, it is particularly effective when the amplifier A, comparator CP, constant current source CCS, and reference potential source are integrated to a single chip. Sign VOF is the offset, expressed as a voltage, generated at the input stage of the amplifier A due to the difference in the characteristics of the input stage transistor of amplifier A or the difference in the impedances of the input circuit.

The operation of the preferred embodiment thus comprised is next described separately for DC operation and AC operation.

When the amplitude Vs of the AC signal source is Vs=0, the output voltage of the amplifier A obviously becomes the DC component only. If this is defined as Vld, the non-inverted input potential V3 of the comparator CP is equal to the value of the voltage drop across resistor R4 added to Vld, $$V3 = Vld + I0 \cdot R4 \quad (16).$$

If the transition gain of the comparator CP is GCP, the output VCP of the comparator CP is $$VCP = (Vld + I0 \cdot R4 - \tfrac{1}{2}Vcc)GCP \quad (17).$$

Therefore, from $$\{VOF - Vld \cdot R1/(R0+R1) - \quad (18)$$
$$(Vld + I0 \cdot R4 - \tfrac{1}{2}Vcc)GCP\}GA = Vld,$$

the amplifier output Vld during DC operation is $$Vld = \{VOF - (I0 \cdot R4 - \quad (19)$$
$$\tfrac{1}{2}Vcc)GCP\}Ga/\{1 + GA \cdot R1/(R0+R1) + GCP \cdot GA\}.$$

Moreover, if the right-side denominator and numerator in equation (19) are divided by GCP·GA, then $$Vld \approx VOF/GCP + \tfrac{1}{2}Vcc - I0 \cdot R4 \quad (20)$$

because GCP·GA > 1. Here, the value of VOF/GCP is extremely small, and because the value of I0·R4 can made very small by design, then finally $$Vld \approx \tfrac{1}{2}Vcc \quad (21)$$

is obtained.

The above equation (21) shows that the DC level of the amplifier output is fixed at approximately $\tfrac{1}{2}$Vcc by operation of the comparator CP.

Next, if the AC component of the output of the amplifier A is V1a and the reactance of the capacitor C3 is Xa, the AC voltage V3 of the comparator input terminal of the comparator CP is $$V3 = V1a \cdot Xa / \{R4^2 + Xa^2\}^{\frac{1}{2}} \quad (22).$$

Thus, the output VCP of the comparator CP becomes $$VCP = V1a \cdot Xa \cdot GCP / \{R4^2 + Xa^2\}^{\frac{1}{2}} \quad (23).$$

Here, because R4 and Xa are selected with respect to the frequency of V1a so that R4 > Xa, the above equation (23) can be simplified to $$VCP = V1a \cdot GCP \cdot Xa / R4 \quad (24).$$

Thus, from $$\{Vs - V1a \cdot R1/(R0+R1) - V1a \cdot GCP \cdot Xa/R4\}GA = V1a \quad (25)$$

the AC output V1a of the amplifier A becomes $$V1a\{1 + R1 \cdot GA/(R0+R1)\} = VS \cdot GA - V1a \cdot Xa \cdot GCP \cdot GA/R4 \quad (26).$$

Here, if Xa/R4 is designed so that V1a·Xa/R4 ≈ 0 at the maximum value of V1a, the comparator CP does not react to AC output signal V1a, and the second part on the right hand side of equation (26) becomes zero. Thus, the AC output V1a of the amplifier is approximated by $$V1a \approx Vs(R0+R1)/R1 \quad (27).$$

This equation (27) proves that an amplifier circuit according to the preferred embodiment is gain controlled by the negative feedback circuit (R0, R1) only for an AC signal. It is to be noted that because the output offset voltage of the present invention is extremely low, it is possible to omit the second series circuit comprising the coupling capacitor C2 and resistor R3.

It is to be noted that the output offset voltage can be set to zero and the output DC voltage can be maintained at ½Vcc, but there are cases when it is desirable to set this output DC voltage to some given value other than ½Vcc. This can be easily achieved in such cases if the constant current source CCS in FIG. 4 is used.

Specifically, when the value of the constant current source CCS is set to 0, an offset compensation operation whereby the output voltage of the amplifier A and the voltage at the contacts of resistor R4 and chip capacitor C3 become equal and equal to ½Vcc is performed, but when a specified output current Iccs is output from the constant current source CCS, the output voltage Vid of the amplifier A becomes $$Vid = \tfrac{1}{2}Vcc - Iccs \cdot R4 \qquad (28).$$

In this case, the voltage of the non-inverting input terminal of comparator CP becomes precisely ½Vcc due to the compensation operation, and the output voltage of the amplifier A is accurately defined by equation (28).

However, because the resistor R4 is fixed, the output voltage of the amplifier A is defined according to the output current of the constant current source CCS, and by changing this value, the output voltage can be set to any desired level.

The present invention was described hereinabove in an embodiment applicable to a non-inverting amplifier circuit, but it will be obvious to those in the industry that the present invention can also be applied to inverting amplifier circuits, and even more simple amplifier circuits, and other devices, for example, equalizer amplifiers.

As described hereinabove, the present invention can reduce the number of component parts, thereby simplifying the assembly process and reducing the size of the amplifier circuit because an offset compensation function is added using an output connected capacitor.

Also according to the present invention, the size of the amplifier circuit can be made smaller and the assembly process for assembly of the amplifier circuit can be simplified because a small capacitor which can be produced as a chip component can be used.

Furthermore, because the value of the output conversion offset voltage becomes one fractional part of the transition gain of the comparator, an extremely small value, the coupling capacitor can also be omitted, and an OCL (output condencer lens) construction can be achieved.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An amplifier circuit comprising:
a negative feedback connected amplifier;
a series circuit comprising a capacitor, one end of which is connected to an output terminal of said amplifier, and a resistor, one end of which is connectable to a reference potential; and
a comparator having first and second inputs and an output, said first input being connected to a junction between said capacitor and said resistor, said second input being connected to an output of said amplifier, and said output of comparator being connected to one input of said amplifier.

2. An amplifier circuit according to claim 1, wherein said amplifier is a single-ended push-pull amplifier operating at a 1.5 V power battery.

3. An amplifier circuit according to claim 1, wherein said amplifier and comparator are formed by an integrated circuit in a single chip.

4. An amplifier circuit comprising:
a negative feedback connected amplifier;
a series circuit comprising a resistor, one end of which is connected to an output terminal of said amplifier, and a relatively low capacitance capacitor, one end of which is connectable to a reference potential;
a comparator having first and second inputs and one output, said first input being connected to a junction between said resistor and said capacitor, and said second input being connectable to a reference potential, and said output of said comparator being connected to an input of said amplifier; and
a constant current source for supplying current to said resistor, whereby the output DC voltage is set to a level determined by the constant current source and resistor.

5. An amplifier circuit according to claim 4, wherein said amplifier is a single-ended push-pull amplifier operating at a 1.5V power battery.

6. An amplifier circuit according to claim 4, wherein said amplifier and comparator are formed by an integrated circuit in a single chip.

* * * * *